United States Patent
Park

(10) Patent No.: US 8,962,357 B2
(45) Date of Patent: Feb. 24, 2015

(54) METHOD FOR MANUFACTURING ORGANIC LIGHT EMITTING DIODE DISPLAY

(71) Applicant: Samsung Display Co., Ltd., Yongin-si, Gyeonggi-do (KR)

(72) Inventor: Dong-Seop Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 13/828,813

(22) Filed: Jun. 28, 2013

(65) Prior Publication Data

US 2014/0073072 A1  Mar. 13, 2014

(30) Foreign Application Priority Data

Sep. 12, 2012  (KR) .......................... 10-2012-0100973

(51) Int. Cl.
*H01L 21/00* (2006.01)
*H01L 51/56* (2006.01)
*H01L 21/56* (2006.01)
*H01L 51/52* (2006.01)

(52) U.S. Cl.
CPC ................ *H01L 51/56* (2013.01); *H01L 21/56* (2013.01); *H01L 51/525* (2013.01); *H01L 2251/566* (2013.01)
USPC .................. 438/25; 438/22; 438/26; 438/28; 438/34; 438/99; 257/40; 257/72; 257/79; 257/88; 257/100; 257/787

(58) Field of Classification Search
CPC ... H01L 21/56; H01L 23/564; H01L 2227/32; H01L 23/28; H01L 33/08
USPC .......... 438/22, 25, 26, 28, 34, 99; 257/40, 72, 257/79, 88, 100, 787
See application file for complete search history.

(56) References Cited

U.S. PATENT DOCUMENTS

| | | | |
|---|---|---|---|
| 2003/0155861 A1* | 8/2003 | Nishizawa et al. ........... | 313/512 |
| 2007/0196949 A1* | 8/2007 | Lee .................................. | 438/99 |
| 2009/0039760 A1* | 2/2009 | Kwon et al. ................... | 313/498 |
| 2009/0053965 A1* | 2/2009 | Kim et al. ........................ | 445/25 |
| 2010/0252599 A1* | 10/2010 | Nakano et al. ..................... | 225/2 |
| 2011/0122633 A1* | 5/2011 | Han et al. ...................... | 362/382 |
| 2012/0235170 A1* | 9/2012 | Lee ................................. | 257/88 |
| 2013/0295814 A1* | 11/2013 | Wei et al. ........................ | 445/23 |

FOREIGN PATENT DOCUMENTS

| | | |
|---|---|---|
| KR | 10-2005-0115742 A | 12/2005 |
| KR | 10-0796128 B1 | 1/2008 |
| KR | 10-2008-0060524 A | 7/2008 |

* cited by examiner

*Primary Examiner* — Bac Au
(74) *Attorney, Agent, or Firm* — Christie, Parker & Hale, LLP

(57) ABSTRACT

A method of manufacturing an organic light emitting diode (OLED) display according to an exemplary embodiment includes: forming a display unit displaying an image and a driver positioned near the display unit to drive a light emitting element of the display unit in a lower mother substrate; forming a sealant and a plurality of bumps in an upper mother substrate; aligning the lower mother substrate and the upper mother substrate to face each other; melting and hardening the sealant to combine the lower mother substrate and the upper mother substrate; cutting the upper mother substrate; and cutting the lower mother substrate, wherein the cutting of the upper mother substrate is performed according to a first cutting line between the sealant and the bumps and a second cutting line corresponding to the bumps.

17 Claims, 10 Drawing Sheets

METHOD FOR MANUFACTURING ORGANIC LIGHT EMITTING DIODE DISPLAY

CROSS-REFERENCE TO RELATED APPLICATION

This application claims priority to and the benefit of Korean Patent Application No. 10-2012-0100973 filed in the Korean Intellectual Property Office on Sep. 12, 2012, the entire contents of which are incorporated herein by reference.

BACKGROUND

1. Field

Aspects of embodiments of the present invention relate to a method of manufacturing an organic light emitting diode (OLED) display.

2. Description of the Related Art

An organic light emitting diode (OLED) display includes a plurality of OLEDs, which each include a hole injection electrode, an organic emission layer, and an electron injection electrode. Each OLED emits light when excitons (generated as electrons and holes are combined) drop from an excited state to a ground state, and the OLED display displays an image by using the emitted light.

Accordingly, the OLED display has self-luminance characteristics, and unlike a liquid crystal display (LCD), the thickness and weight thereof are small because a separate light source is not required. Further, because the OLED display has high quality characteristics, such as low power consumption, high luminance, and high reaction speed, the OLED display is appropriate for use in mobile electronic devices.

However, the OLED may become deteriorated due to internal and/or external factors. Regarding the internal factors, the organic emissive layer may become deteriorated under the atmosphere of oxygen due to indium tin oxide (ITO) being the electrode material, or under the interfacial reaction between organic layer components of the organic emissive layer. The external factors include external moisture and oxygen, and ultraviolet rays. In particular, because the external oxygen and moisture seriously influence the life span of the OLED, it may be desirable to package the OLED such that it is sealed from the outside in a vacuum-tight manner.

The organic light emitting diode (OLED) display includes a pixel area where the organic light emitting element is formed and a non-pixel area where a scan driver and a pad portion are formed. An encapsulation substrate to protect the organic light emitting element may be formed on the pixel area including the organic light emitting element.

Additionally, the organic light emitting diode (OLED) display may be formed by forming a plurality of organic light emitting diode (OLED) displays on a mother substrate, and cutting each organic light emitting diode (OLED) display as a unit cell, and then, a lower substrate may be cut after cutting the encapsulation substrate.

However, the encapsulation substrate may be damaged by stresses generated in a cutting process, which may allow external oxygen and/or moisture to penetrate the display device.

The above information disclosed in this Background section is only for enhancement of understanding of the background of the described technology, and therefore, it may contain information that does not form the prior art that is already known in this country to a person of ordinary skill in the art.

SUMMARY

One or more embodiments of the present invention provide a method of manufacturing an organic light emitting diode (OLED) display in which damage by a cutting process is prevented (or reduced).

A method of manufacturing an organic light emitting diode (OLED) display according to an exemplary embodiment includes: forming a display unit, which is for displaying an image, and a driver, which is positioned near the display unit to drive a light emitting element of the display unit, on a lower mother substrate; forming a sealant and a plurality of bumps on an upper mother substrate; aligning the lower mother substrate and the upper mother substrate to face each other; melting and hardening the sealant to attach the lower mother substrate to the upper mother substrate; cutting the upper mother substrate; and cutting the lower mother substrate. Here, the cutting of the upper mother substrate is performed along a first cutting line, which is between the sealant and the bumps, and along a second cutting line corresponding to the bumps.

The bumps may be formed at intervals according to the second cutting line. The intervals may be smaller than a wheel diameter of a cutter.

The bumps may be formed in a plurality of columns according to the second cutting line, and bumps of adjacent columns may be alternately positioned.

The bumps may be formed with the same material as the sealant. According to an embodiment of the present invention, the bumps and the sealant include frit glass.

A plane shape of the bump may be circular or polygonal. The bumps may be inclined with respect to the second cutting line.

The method may further include: curing the bumps and the sealant before aligning the upper mother substrate and the lower mother substrate.

The method may further include melting the bumps after aligning the upper mother substrate and the lower mother substrate. According to an embodiment of the present invention, the bumps are not hardened after the melting operation.

The first cutting line may be spaced apart from the sealant by about 0.07 mm.

According to an embodiment of the present invention, the display unit includes at least one pixel including: the light emitting element; and a pixel circuit coupled to the light emitting element and including at least one transistor and at least one capacitor.

According to another embodiment of the present invention, a method of manufacturing a plurality of organic light emitting diode (OLED) displays includes: forming a plurality of display units, each of which is for displaying an image, and a plurality of drivers, each of which is positioned near a corresponding display unit to drive a light emitting element of the corresponding display unit, on a lower mother substrate; forming a sealant and a plurality of bumps on an upper mother substrate; aligning the lower mother substrate and the upper mother substrate to face each other; melting and then hardening the sealant to attach the lower mother substrate to the upper mother substrate; cutting the upper mother substrate; and cutting the lower mother substrate. Here, the display units are arranged in rows and columns on the lower mother substrate, and the cutting of the upper mother substrate is performed along a plurality of first cutting lines that are between the sealant and the bumps and along a plurality of second cutting lines corresponding to the bumps.

The bumps, the first cutting lines, and the second cutting lines may each be located between adjacent rows of the display units.

The cutting of the upper substrate may further be performed along a plurality of third cutting lines that are located between adjacent columns of the display units. The third cutting lines may be spaced apart from the sealant by about 0.07 mm.

BRIEF DESCRIPTION OF THE DRAWINGS

The above and other features and aspects of the present invention will become more apparent from the detailed description taken in conjunction with the figures, which illustrate exemplary embodiments of the present invention.

DETAILED DESCRIPTION

Figure 1:
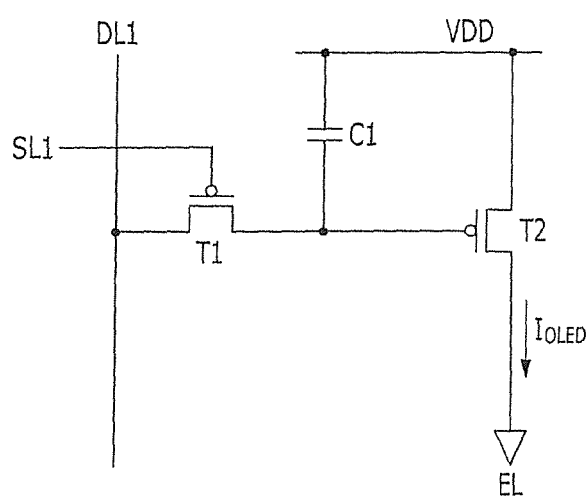
FIG. 1 is an equivalent circuit of an organic light emitting diode (OLED) display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of the elements shown in the drawings are arbitrarily illustrated for better understanding and ease of description, and the present invention is not necessarily limited thereto. For example, in the drawings, the thickness of layers, films, panels, regions, etc., are exaggerated for clarity.

Herein, when an element such as a layer, film, region, or substrate is referred to as being "on" another element, it can be directly on the another element or one or more intervening elements may be interposed therebetween. In addition, when an element is referred to as being "coupled" (e.g., electrically coupled or connected) to another element, it may be directly coupled to the another element or indirectly coupled to the another element with one or more other elements interposed therebetween.

In addition, unless explicitly described to the contrary, the word "comprise" and variations such as "comprises" or "comprising" will be understood to imply the inclusion of stated elements but not the exclusion of any other elements. In addition, "on" is either positioned on or below a portion of a target or positioned on the upper side based on a gravity direction, throughout the specification.

A method of manufacturing an organic light emitting diode (OLED) display according to an exemplary embodiment will now be described with reference to the accompanying drawings.

Figure 2:
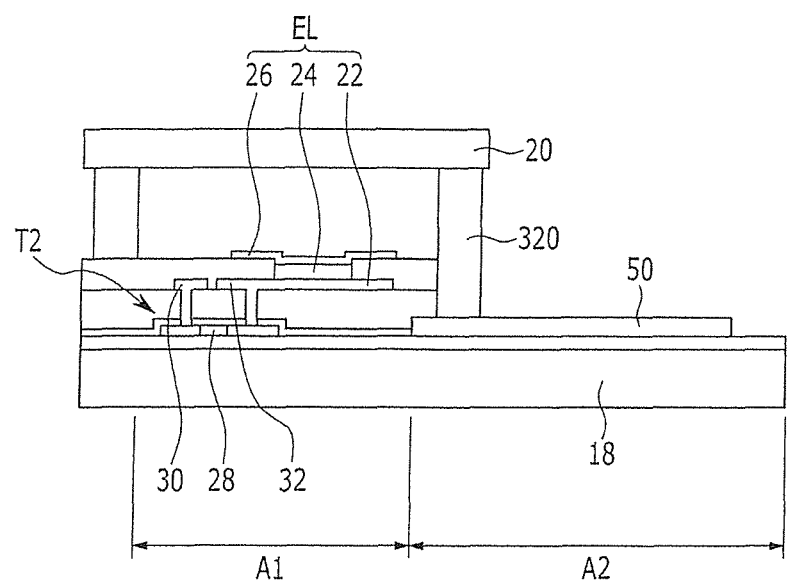
FIG. 2 is a schematic cross-sectional view of the organic light emitting diode (OLED) display shown in FIG. 1.

FIG. 1 is an equivalent circuit of a pixel of an organic light emitting diode (OLED) display according to an exemplary embodiment, and FIG. 2 is a schematic cross-sectional view of the organic light emitting diode (OLED) display shown in FIG. 1.

As shown in FIG. 2, the organic light emitting diode (OLED) display includes a substrate 18 and an encapsulation substrate 20 facing each other, and the substrate 18 and the encapsulation substrate 20 are sealed by a sealant 320. The substrate 18 includes a display unit A1 including a plurality of pixels and a driver A2 to drive the display unit A1.

One pixel of the display unit A1 includes an organic light emitting element EL and a driving circuit. The organic light emitting element EL includes a first electrode (a hole injection electrode) 22, an organic emission layer 24, and a second electrode (an electron injection electrode) 26.

The organic emission layer 24 may further include an emission layer (not shown) that substantially emits light, and organic layers (not shown) for efficient transmission of holes or electrons to the emission layer. The organic layers may include a hole injection layer (HIL) and a hole transport layer (HTL) between the first electrode 22 and the emission layer, and a hole injection layer (HIL) and a hole transport layer (HTL) between the second electrode 26 and the emission layer.

A driving circuit may include at least two thin film transistors T1 and T2 and at least one storage capacitor C1. The at least two thin film transistors may include a switching transistor T1 and a driving transistor T2.

In FIG. 1, the switching transistor T1 is coupled to a scan line SL1 and a data line DL1, and transmits the data voltage input to the data line DL1 to the driving transistor T2 according to the switching voltage input to the scan line SL1. The storage capacitor C1 is coupled to the switching transistor T1 and a power source line VDD, and stores a voltage corresponding to a difference between the voltage transmitted from the switching transistor T1 and the voltage supplied to the power source VDD.

The driving transistor T2 is coupled to the power source line VDD and the storage capacitor C1 and supplies an output current $I_{OLED}$ that is proportional to the square of a voltage difference of a voltage stored in the storage capacitor C1 and a threshold voltage to the OLED EL. The OLED EL emits light according to the output current $I_{OLED}$. The driving transistor T2 includes a source electrode 30, a drain electrode 32, and a gate electrode 28. The anode 22 of the OLED EL may be connected to the drain electrode 32 of the driving transistor T2. A configuration of the pixel is not limited to the above-described example, and can be variously modified.

The driver A2 includes pad wires and a pad 50 such as a fan-out portion to apply the signals to a plurality of signal lines from the outside.

As shown in FIG. 2, the encapsulation substrate 20 is formed on the second electrode 26. The encapsulation substrate 20 is sealed by the substrate 18 and the sealant 320, thereby sealing and protecting a plurality of organic light emitting elements EL formed on the substrate 18, the organic light emitting element EL formed on the driving circuit unit, and the driving circuit unit from the outside. According to one or more embodiments of the present invention, the pad 50 is not sealed and is exposed to be connected to an external circuit.

Next, a method of manufacturing the above-described organic light emitting diode (OLED) display will be described with reference to FIGS. 3 to 10.

Figure 3:
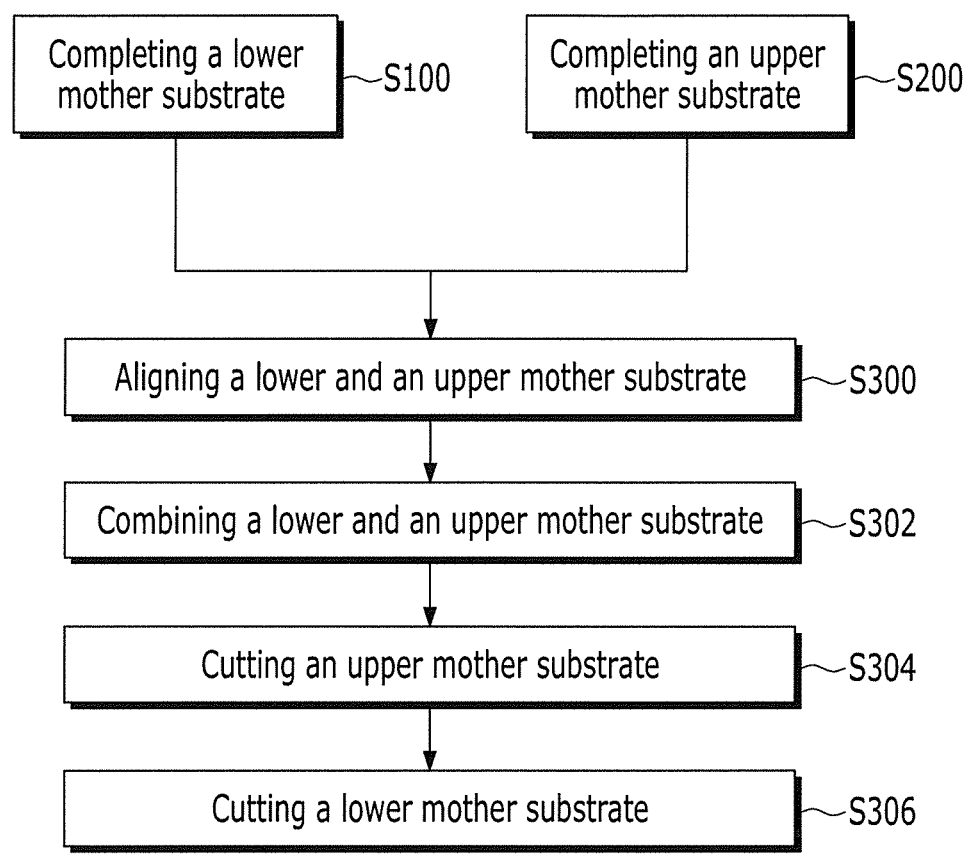
FIG. 3 is a flowchart illustrating a method of manufacturing an organic light emitting diode (OLED) display from a mother panel according to an exemplary embodiment of the present invention.

FIG. 3 is a flowchart illustrating a method of manufacturing an organic light emitting diode (OLED) display from a mother panel according to an exemplary embodiment, FIGS. 4 to 7 are views illustrating a sequence of manufacturing the organic light emitting diode (OLED) display according to an exemplary embodiment according to the flowchart of FIG. 3, and FIGS. 8 to 10 are layout views of an upper mother substrate according to another exemplary embodiment.

As shown in FIG. 3, a method of manufacturing an organic light emitting diode (OLED) display includes: forming a plurality of organic light emitting diode (OLED) displays on a lower mother substrate to complete a lower mother substrate S100; forming a sealant and a bump on an upper mother substrate to complete the upper mother substrate S200; aligning the upper mother substrate on the lower mother substrate S300; combining the upper mother substrate and the lower mother substrate to complete a mother panel S302; and cutting the upper mother substrate S304 and cutting the lower mother substrate S306 to divide the mother panel into each organic light emitting diode (OLED) display.

Figure 4:
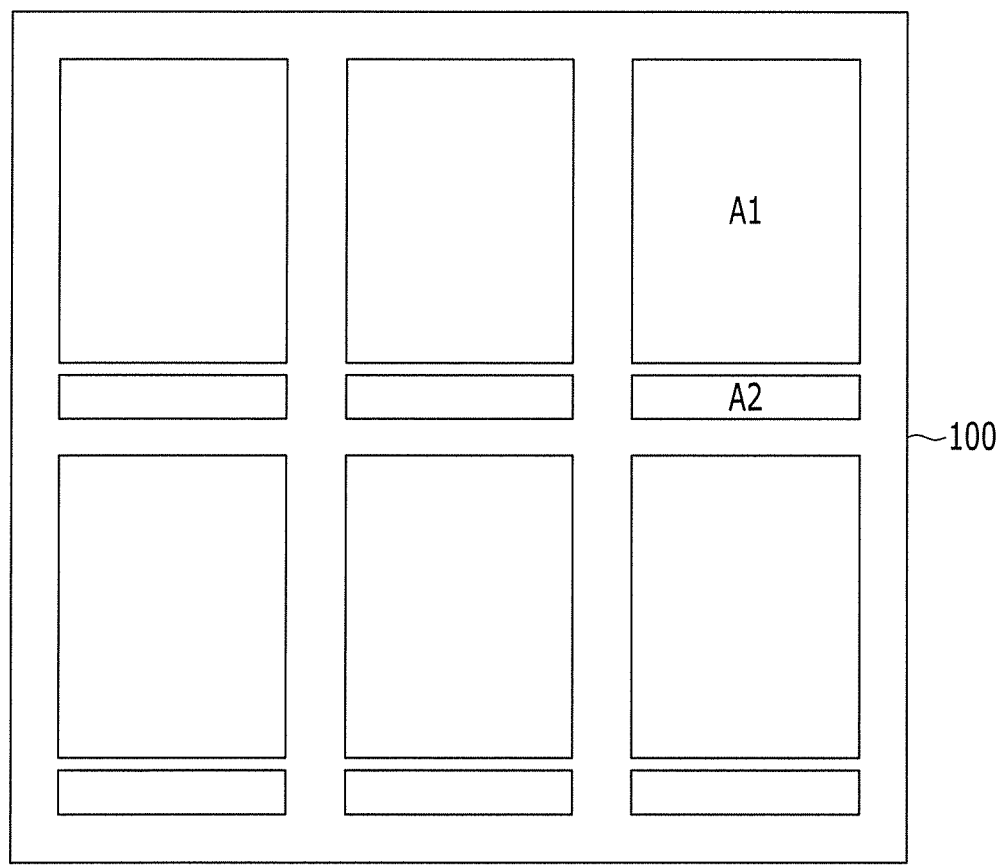
FIG. 4 to FIG. 7 are views illustrating a sequence of manufacturing the organic light emitting diode (OLED) display according to an exemplary embodiment according to the flowchart of FIG. 3.

In detail, firstly, as shown in FIGS. 3 and 4, a plurality of display units A1, including a plurality of pixels, and a plurality of drivers A2 are respectively formed on a lower mother substrate 100 (S100).

A plurality of signal lines for displaying an image, and a switching transistor T1, a driving transistor T2, and the like coupled thereto are formed in the display region A1 on the substrate 110. The signal lines include a scanning signal line SL1 for transferring a gate signal (or a scan signal), a data line DL1 for transferring a data signal, a driving voltage line (or power source line) VDD for transferring a driving voltage, and the like. Also, a pad to apply the signals to the signal lines is positioned in the driver A2.

Figure 5:
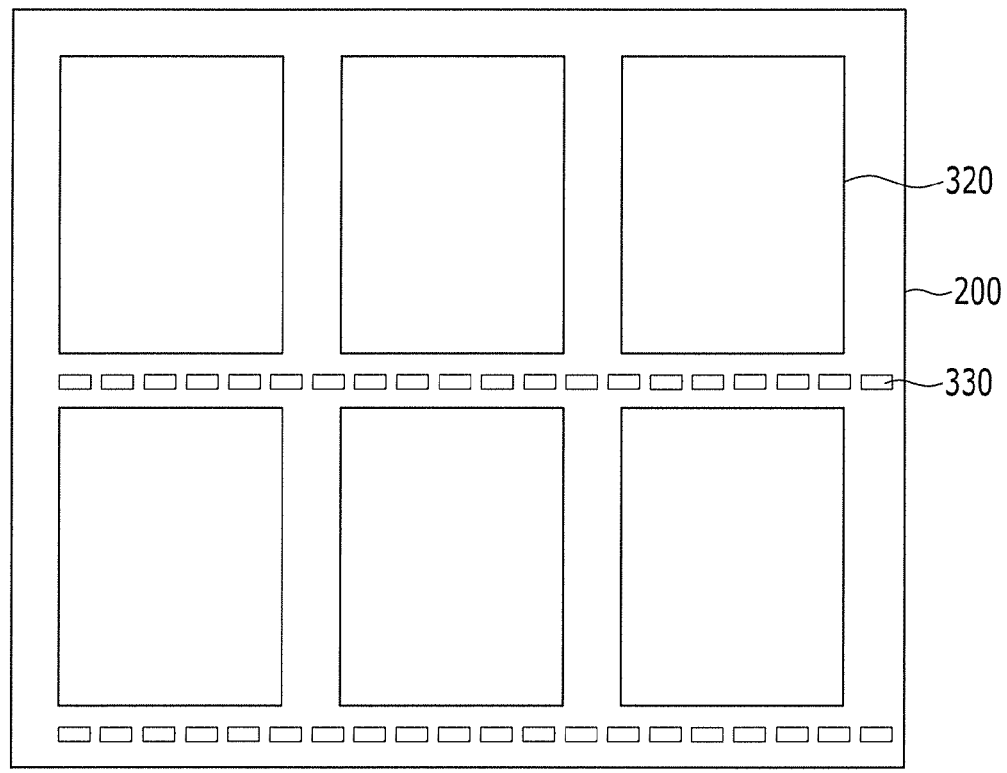

Next, as shown in FIGS. 3 and 5, a sealant 320 and a bump 330 are formed on the upper mother substrate 200 (S200).

The sealant 320 may be formed according to an edge (or periphery) of the display unit A1, encloses (at least in part) the display unit A1, and may overlap with the pad wire of the fan-out portion.

The bump 330 is separated from the sealant 320 and may be formed at a position corresponding to the pad 50 of the driver A2.

Figure 8:
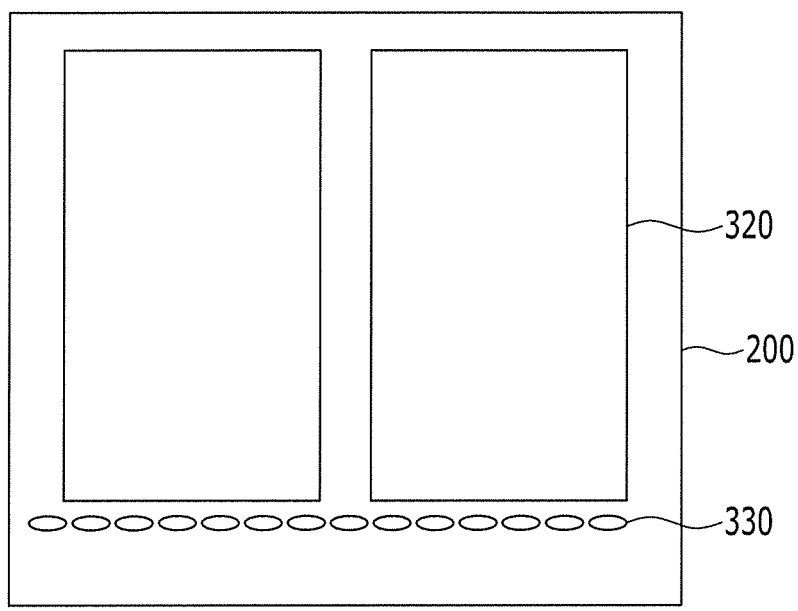
FIGS. 8 to 10 are layout views of an upper mother substrate according to another exemplary embodiment.

Multiple bumps 330, as shown in FIG. 5, may be positioned on the same line with a suitable (or designed or predetermined) interval therebetween. As shown in FIG. 5, each bump 330 may be polygonal, such as a quadrangle, or as shown in FIG. 8, may be substantially circular (e.g., elliptical).

Figure 9:
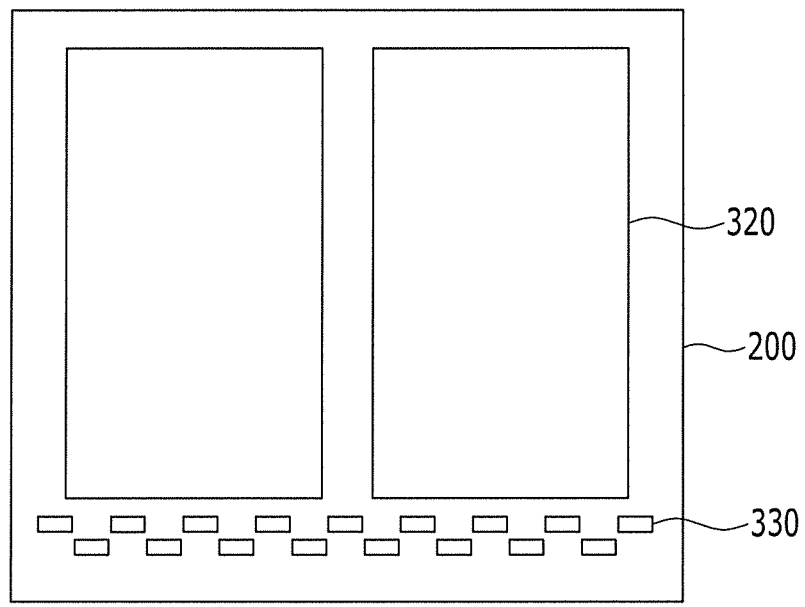
Figure 10:
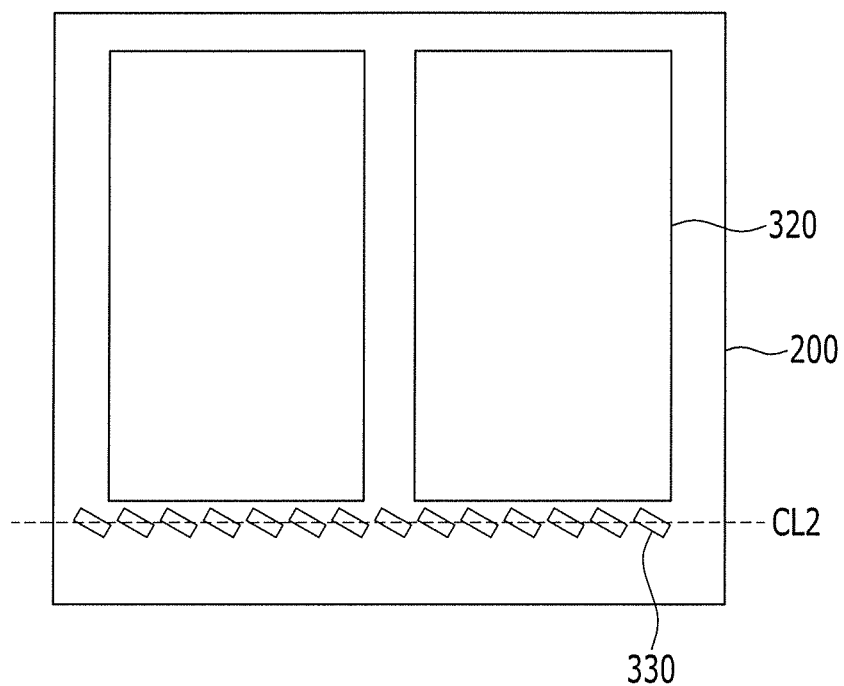

Also, as shown in FIG. 9, the bumps 330 may be positioned to form a plurality of columns, and the bumps 330 of two neighboring columns may be alternately positioned. Further, as shown in FIG. 10, the bumps 330 may be obliquely inclined with respect to the second cutting line CL2 or the edge of the substrate. In one or more embodiments, the interval of the bumps 330 is smaller than a wheel diameter of a cutter. While the bumps 330 have been described above in connection with particular shapes and arrangements, the bumps 330 may have various shapes and arrangements.

The sealant 320 and the bumps 330 may be formed with the same material, for example, a frit glass. The frit glass may be made of at least one material selected from a group including potassium oxide ($K_2O$), iron(III) oxide ($Fe_2O_3$), antimony trioxide ($Sb_2O_3$), zinc oxide (ZnO), phosphorus pentoxide ($P_2O_5$), vanadium(V) oxide ($V_2O_5$), titanium dioxide ($TiO_2$), aluminum oxide ($Al_2O_3$), boron trioxide ($B_2O_3$), tungsten trioxide ($WO_3$), tin oxide (SnO), and lead oxide (PbO).

At this time, the sealant 320 and the bumps 330 may be preliminarily cured to prevent them from being shaken or deformed when being moved.

Figure 6:
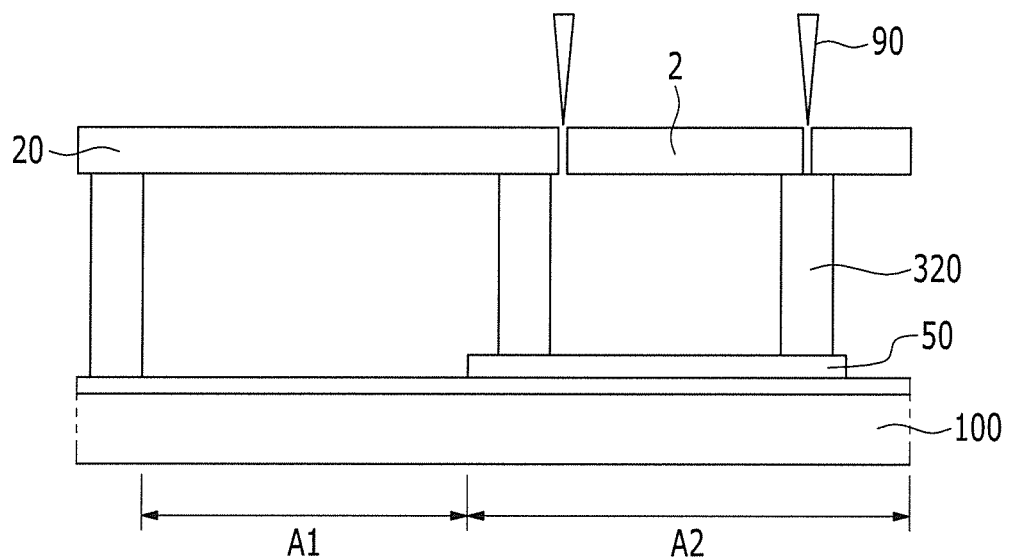

Next, as shown in FIGS. 2 and 6, an upper mother substrate 200 and the lower mother substrate 100 are aligned (S300). They are aligned for the display unit A1 of the lower mother substrate 100 to be positioned within a boundary at which the sealant 320 of the upper mother substrate 100 is formed.

Next, the sealant 320 may be irradiated with a laser or infrared rays so that it melts, and then, the sealant 320 is again hardened such that the upper mother substrate 200 and the lower mother substrate 100 may be completely adhered (or attached) to each other. Accordingly, the organic light emitting element may be completely sealed, and thereby, be protected from oxygen and moisture. At this time, the bumps 330 are melted, but are not re-hardened.

Next, after cutting the upper mother substrate 200 by using a cutter 90, a substrate piece 2 between the cutting line is removed to expose the pad 50 of the driver A2 of the organic light emitting diode (OLED) display. The bumps 330 are also removed, and here, the bumps 330 are again melted and are not hardened after the combination such that the bumps 330 are easily removed in the preliminarily cured state.

Figure 7:
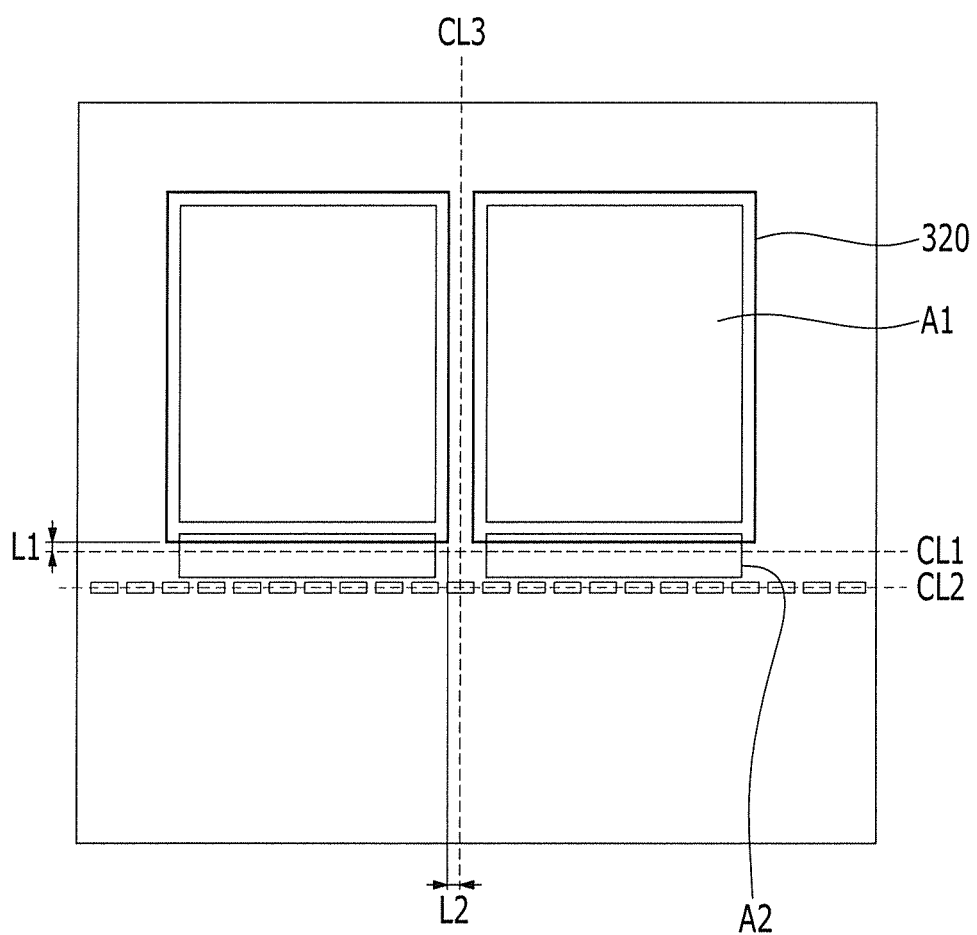

The cutting is performed according to the first cutting line CL1 and the second cutting line CL2, as shown in FIG. 7. According to an embodiment of the present invention, a distance L1 between the first cutting line CL1 and the sealant is about 0.07 mm, and the second cutting line CL1 is positioned on the bumps 330.

When cutting by using the cutter, the stresses are concentrated at the bumps 330 such that damage to the upper mother substrate 200 may be smoothed or prevented.

When forming the bumps 330 according to an exemplary embodiment, the pressure applied to the cutter when the wheel of the cutter contacts the upper mother substrate 200 is transmitted to the bumps 330, and thereby, the damage (e.g., damage to the lower driver A2 or the encapsulation substrate 20) may be prevented. Also, by forming a plurality of bumps 330 (such as in an exemplary embodiment), the stresses generated when the wheel of the cutter 90 contacts the cutting lines may be dispersed. That is, when one bump 330 is elongated according to one edge of the organic light emitting diode (OLED) display, the generated stresses are not dispersed and are concentrated into one position such that the upper mother substrate may be damaged. However, such as in an exemplary embodiment, when forming a plurality of bumps 330, the concentration of the stresses may be spread out or prevented such that the upper mother substrate is not damaged by the stresses.

Next, the cutting is performed according to the third cutting line CL3. The distance L2 between the third cutting line CL3 and the sealant 320 may be about 0.07 mm.

Next, the lower mother substrate 100 is cut, as shown in FIG. 2, to be separated into individual organic light emitting diode (OLED) displays.

While this disclosure has been described in connection with what is presently considered to be exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A method of manufacturing an organic light emitting diode (OLED) display, the method comprising:
   forming a display unit, which is for displaying an image, and a driver, which is positioned near the display unit to drive a light emitting element of the display unit, on a lower mother substrate;

forming a sealant and a plurality of bumps on an upper mother substrate;

aligning the lower mother substrate and the upper mother substrate to face each other;

melting and hardening the sealant to attach the lower mother substrate to the upper mother substrate;

cutting the upper mother substrate; and cutting the lower mother substrate, wherein the cutting of the upper mother substrate is performed along a first cutting line, which is between the sealant and the bumps, and along a second cutting line corresponding to the bumps.

2. The method of claim 1, wherein
the bumps are formed at intervals according to the second cutting line.

3. The method of claim 2, wherein
the intervals are smaller than a wheel diameter of a cutter.

4. The method of claim 2, wherein
the bumps are formed in a plurality of columns according to the second cutting line, and bumps of adjacent ones of the columns from among the bumps are alternately positioned.

5. The method of claim 1, wherein
the bumps are formed with the same material as the sealant.

6. The method of claim 5, wherein
the bumps and the sealant comprise frit glass.

7. The method of claim 1, wherein
a plane shape of the bumps is circular or polygonal.

8. The method of claim 7, wherein
the bumps are inclined with respect to the second cutting line.

9. The method of claim 1, further comprising:
curing the bumps and the sealant before aligning the upper mother substrate and the lower mother substrate.

10. The method of claim 1, further comprising:
melting the bumps after aligning the upper mother substrate and the lower mother substrate.

11. The method of claim 10, wherein
the bumps are not hardened after the melting operation.

12. The method of claim 1, wherein
the first cutting line is spaced apart from the sealant by about 0.07 mm.

13. The method of claim 1, wherein
the display unit comprises at least one pixel comprising:
the light emitting element; and
a pixel circuit coupled to the light emitting element and comprising at least one transistor and at least one capacitor.

14. A method of manufacturing a plurality of organic light emitting diode (OLED) displays, the method comprising:
forming a plurality of display units, each of which is for displaying an image, and a plurality of drivers, each of which is positioned near a corresponding display unit to drive a light emitting element of the corresponding display unit, on a lower mother substrate;

forming a sealant and a plurality of bumps on an upper mother substrate;

aligning the lower mother substrate and the upper mother substrate to face each other;

melting and then hardening the sealant to attach the lower mother substrate to the upper mother substrate;

cutting the upper mother substrate; and cutting the lower mother substrate, wherein the display units are arranged in rows and columns on the lower mother substrate, and wherein the cutting of the upper mother substrate is performed along a plurality of first cutting lines that are between the sealant and the bumps and along a plurality of second cutting lines corresponding to the bumps.

15. The method of claim 14, wherein
the bumps, the first cutting lines, and the second cutting lines are each located between adjacent rows of the display units.

16. The method of claim 14, wherein
the cutting of the upper substrate is further performed along a plurality of third cutting lines that are located between adjacent columns of the display units.

17. The method of claim 16, wherein
the third cutting lines are spaced apart from the sealant by about 0.07 mm.

* * * * *